(12) United States Patent
Kobayashi

(10) Patent No.: US 8,040,052 B2
(45) Date of Patent: Oct. 18, 2011

(54) LIGHT-EMITTING DEVICE, METHOD FOR MANUFACTURING THE SAME, AND ELECTRONIC APPARATUS

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 343 days.

(21) Appl. No.: 12/018,510

(22) Filed: Jan. 23, 2008

(65) Prior Publication Data
US 2008/0218070 A1 Sep. 11, 2008

(30) Foreign Application Priority Data

Mar. 7, 2007 (JP) .................................. 2007-056697

(51) Int. Cl.
*H01L 51/00* (2006.01)
(52) U.S. Cl. ........................... 313/506; 313/504; 445/24
(58) Field of Classification Search .............. 445/24–25; 313/498–512
See application file for complete search history.

(56) References Cited

U.S. PATENT DOCUMENTS

| 7,030,553 | B2 | 4/2006 | Winters et al. | |
|---|---|---|---|---|
| 7,548,019 | B2 | 6/2009 | Omura et al. | |
| 2002/0014470 | A1* | 2/2002 | Okada et al. | 216/24 |
| 2004/0012331 | A1* | 1/2004 | Yamazaki et al. | 313/506 |
| 2005/0225232 | A1* | 10/2005 | Boroson et al. | 313/504 |
| 2005/0280364 | A1* | 12/2005 | Omura et al. | 313/506 |
| 2006/0238120 | A1 | 10/2006 | Miller et al. | |
| 2007/0090751 | A1* | 4/2007 | Cok et al. | 313/501 |
| 2007/0228938 | A1* | 10/2007 | Hatwar et al. | 313/504 |

FOREIGN PATENT DOCUMENTS

| CN | 1717135 A | 1/2006 |
|---|---|---|
| CN | 1839478 A | 9/2006 |
| JP | A-2000-100560 | 4/2000 |
| JP | A 2001-57290 | 2/2001 |
| JP | A-2003-178875 | 6/2003 |
| JP | A-2006-32327 | 2/2006 |
| JP | A-2006-47592 | 2/2006 |
| JP | A-2007-503093 | 2/2007 |
| WO | WO 2005/020344 A1 | 3/2005 |
| WO | WO 2006/116346 A2 | 11/2006 |

* cited by examiner

*Primary Examiner* — Anne Hines
(74) *Attorney, Agent, or Firm* — Oliff & Berridge, PLC

(57) ABSTRACT

A light-emitting device includes a plurality of pixels constituting a screen, each of the plurality of pixels including four subpixels, which are a red subpixel, a green subpixel, a blue subpixel, and a white subpixel. The red subpixel has a light-emitting layer formed of a red-light-emitting material that emits red light and extending along the screen, and a color filter provided above the light-emitting layer to transmit red light. The green subpixel has a light-emitting layer formed of a white-light-emitting material that emits white light and extending along the screen, and a color filter provided above the light-emitting layer to transmit green light. The blue subpixel has a light-emitting layer formed of a blue-light-emitting material that emits blue light and extending along the screen, and a color filter provided above the light-emitting layer to transmit blue light. The white subpixel has a light-emitting layer formed of the white-light-emitting material and extending along the screen.

12 Claims, 12 Drawing Sheets

FIG. 4

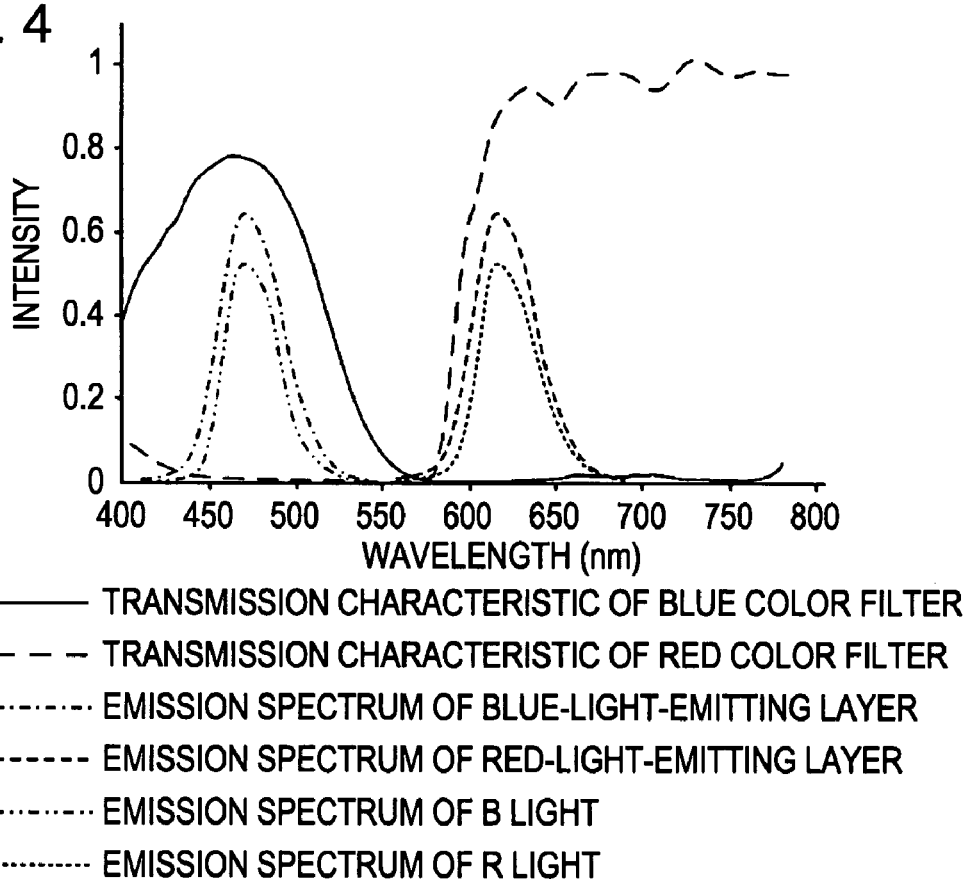

—— TRANSMISSION CHARACTERISTIC OF BLUE COLOR FILTER
– – – TRANSMISSION CHARACTERISTIC OF RED COLOR FILTER
–·–·– EMISSION SPECTRUM OF BLUE-LIGHT-EMITTING LAYER
- - - - EMISSION SPECTRUM OF RED-LIGHT-EMITTING LAYER
–··–·· EMISSION SPECTRUM OF B LIGHT
········ EMISSION SPECTRUM OF R LIGHT

FIG. 5

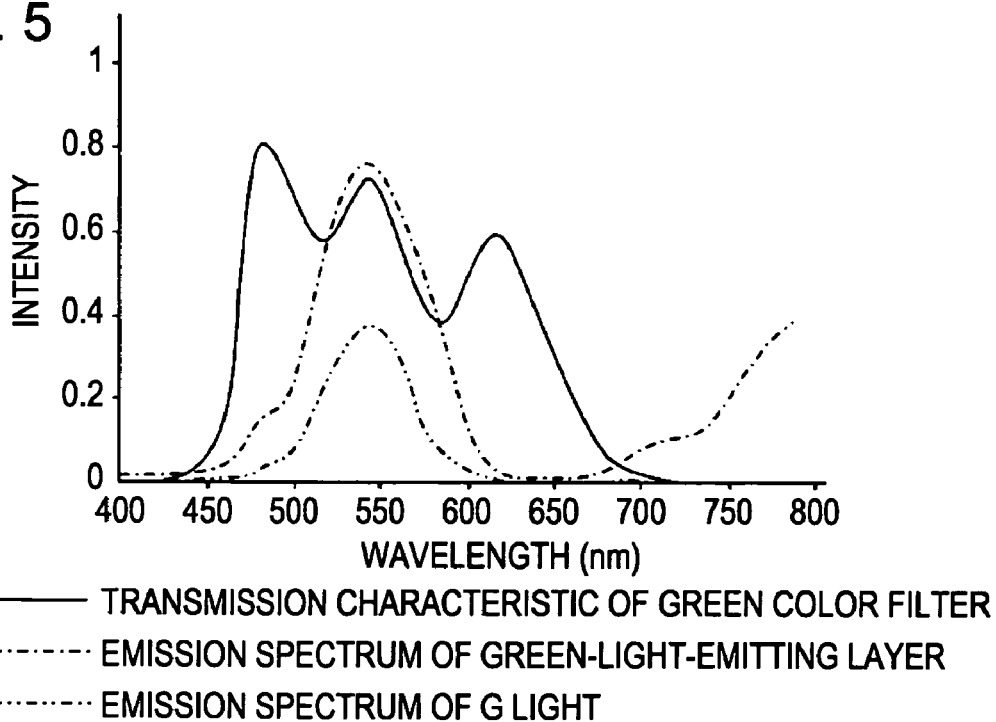

—— TRANSMISSION CHARACTERISTIC OF GREEN COLOR FILTER
–·–·– EMISSION SPECTRUM OF GREEN-LIGHT-EMITTING LAYER
········ EMISSION SPECTRUM OF G LIGHT

LIGHT-EMITTING DEVICE, METHOD FOR MANUFACTURING THE SAME, AND ELECTRONIC APPARATUS

BACKGROUND

1. Technical Field

The present invention relates to a light-emitting device, a method for manufacturing the same, and an electronic apparatus.

2. Related Art

Light-emitting devices (full-color display devices) for displaying a color image on a screen, the light-emitting devices including a plurality of pixels that constitute a screen, each of the pixels including a plurality of subpixels, each of the subpixels including an electroluminescent (EL) element, such as an organic EL element or an inorganic EL element, have been developed. Examples of such light-emitting devices include RGB light-emitting devices, in which each of the pixels includes red, green, and blue subpixels, and RGBW light-emitting devices, in which each of the pixels includes red, green, blue, and white subpixels.

Examples of the RGB light-emitting devices include: a first device, in which a light-emitting layer of each of the subpixels is formed of an EL material that emits colored light corresponding to the subpixel; a second device, as disclosed in JP-A-2001-57290, in which light-emitting layers of the subpixels are formed of an EL material that emits white light, and each of the subpixels includes a color filter with the characteristic corresponding to the color of the subpixel; and a third device, in which light-emitting layers of the subpixels are formed of an EL material that emits blue light, and each of the red and green subpixels includes a color-conversion layer with the characteristic corresponding to the color of the subpixel.

An example of the RGBW light-emitting device is a fourth device, in which light-emitting layers of the subpixels are formed of an EL material that emits white light, and each of the red, green, and blue subpixels includes a color filter with the characteristic corresponding to the color of the subpixel. The fourth device has a white subpixel in addition to the configuration of the second device. When a pixel displays white, the light emitted from the light-emitting layer of the white subpixel is used.

The first device requires the use of a polarizing plate for preventing reflection of external light, thereby having low utilization efficiency of emitted light. The second device loses a significant portion of the emitted light because of the presence of the color filters, thereby having low utilization efficiency of emitted light. The third device requires the use of the color filters to block entrance of unwanted light, and loses a portion of the emitted light because of the presence of the color-conversion layers and the color filters, thereby having low utilization efficiency of emitted light. Accordingly, the first to third devices have low utilization efficiency of emitted light. In order to realize sufficiently high display quality, the first to third devices have to consume a large amount of power.

The fourth device has a sufficiently high utilization efficiency of emitted light, because, when a pixel displays white, light emitted from the white subpixel is output unobstructed. However, when a pixel displays red, green, or blue, the utilization efficiency of emitted light in the fourth device is reduced to the same level as the second device. Because red and blue are less easily perceived in human vision than green, a pixel consumes more power to display red or blue than green. To reduce power consumption, it is important to improve the utilization efficiency of emitted light when a pixel displays red or blue. As described above, however, the utilization efficiency of emitted light when a pixel displays red or blue is as low as 30% or 10% in the fourth device. In order to realize sufficiently high display quality, the fourth device also has to consume a large amount of power.

Now, let us consider a fifth device, which is a modification of the fourth device. In the fifth device, a light-emitting layer of each of the subpixels is formed of an EL material that emits colored light corresponding to the subpixel. Because the utilization efficiency of emitted light in each of the subpixels is sufficiently high in the fifth device, the power consumption can be reduced. However, four types of EL materials need to be used in the manufacturing process. It is clear that the manufacturing process of the fifth device is extremely complex compared with that of the first device, which requires the use of three types of EL materials.

SUMMARY

An advantage of some aspects of the invention is that it provides a light-emitting device capable of realizing sufficiently high display quality at low power consumption while avoiding complicating the manufacturing process, a method for manufacturing the light-emitting device, and an electronic apparatus.

According to an aspect of the invention, a light-emitting device includes a plurality of pixels constituting a screen, each of the plurality of pixels including four subpixels, which are a red subpixel, a green subpixel, a blue subpixel, and a white subpixel. The red subpixel has a light-emitting layer formed of a red-light-emitting material that emits red light and extending along the screen, and a color filter provided above the light-emitting layer to transmit red light. The green subpixel has a light-emitting layer formed of a white-light-emitting material that emits white light and extending along the screen, and a color filter provided above the light-emitting layer to transmit green light. The blue subpixel has a light-emitting layer formed of a blue-light-emitting material that emits blue light and extending along the screen, and a color filter provided above the light-emitting layer to transmit blue light. The white subpixel has a light-emitting layer formed of the white-light-emitting material and extending along the screen. Each of the subpixels includes one light-emitting element (for example, an EL element such as an organic EL element).

This light-emitting device has a sufficiently high utilization efficiency of light emitted from the light-emitting layers of the white, red, and blue subpixels. Therefore, this light-emitting device realizes sufficiently high display quality at low power consumption. In addition, because the light-emitting layers of the green and white subpixels are formed of the same material, this light-emitting device requires three types of materials in forming the light-emitting layers. Therefore, this light-emitting device does not complicate the manufacturing process. Accordingly, this light-emitting device realizes sufficiently high display quality at low power consumption while avoiding complicating the manufacturing process.

The light-emitting device according to the above-described aspect preferably further includes a planar element substrate. The light-emitting layer of each of the four subpixels is preferably provided on the element substrate. The light-emitting layer of each of the red, green, and blue subpixels is preferably disposed between the color filter thereof and the element substrate. Each of the four subpixels preferably has a transmissive layer that transmits light provided between the light-emitting layer thereof and the element substrate. Each of the red, green, and blue subpixels preferably has a reflective layer that reflects light provided between the transmissive layer thereof and the element substrate.

This structure provides a top-emission light-emitting device, in which light emitted from the light-emitting layers is output in a direction away from the element substrate. By appropriately setting the thickness of the transmissive layers, taking interference of light into consideration, the brightness of at least one of the red, green, and blue subpixels can be increased. Further, by appropriately and independently setting the thickness of the transmissive layer of each of the red, green, and blue subpixels, taking interference of light into consideration, the brightness of all the red, green, and blue subpixels can be increased. Thus, the power consumption can be further reduced and the display quality can be further improved by appropriately setting the thickness of the transmissive layers, taking interference of light into consideration.

The light-emitting device according to the above-described aspect preferably further includes a planar element substrate and a light-absorbing layer that absorbs light provided under the element substrate. The light-emitting layer of each of the four subpixels is preferably provided on the element substrate. The light-emitting layer of each of the red, green, and blue subpixels is preferably disposed between the color filter thereof and the element substrate.

This structure also provides a top-emission light-emitting device, in which light emitted from the light-emitting layers is output in a direction away from the element substrate. This structure provides an advantage in that, because of the presence of the light-absorbing layer, the contrast of images can be maintained when a transparent element substrate is used.

The light-emitting device according to the above-described aspect preferably further includes a planar element substrate. The light-emitting layer of each of the four subpixels is preferably provided on the element substrate. The light-emitting layer of each of the red, green, and blue subpixels is preferably disposed between the color filter thereof and the element substrate. Each of the four subpixels preferably has a transmissive layer that transmits light provided between the light-emitting layer thereof and the element substrate. The white subpixel preferably has a reflective layer that reflects light provided between the transmissive layer thereof and the element substrate. The transmissive layer of the white subpixel preferably has a plurality of portions having different thicknesses.

This structure also provides a top-emission light-emitting device, in which light emitted from the light-emitting layers is output in a direction away from the element substrate. In this structure, the white subpixel has the reflective layer between the light-emitting layer and the element substrate. Therefore, by appropriately setting the thickness of the transmissive layer between the light-emitting layer and the element substrate, taking interference of light into consideration, the brightness of the white subpixel can be increased. However, because the light-emitting layer of the white subpixel usually has a broad emission spectrum, if light of a certain wavelength among the light emitted from the light-emitting layer is intensified by interference, the white subpixel may display a color other than white. In other words, the color purity of the white subpixel may degrade. In the present structure, however, because the transmissive layer of the white subpixel has the portions having different thicknesses, light having other wavelengths is also intensified by interference. Accordingly, this structure increases the brightness of the white subpixel while minimizing degradation of the color purity of the white subpixel.

In the light-emitting device of the above-described structure, an emission spectrum of the white-light-emitting material preferably includes a plurality of peaks. Each of the plurality of portions of the transmissive layer of the white subpixel preferably has a thickness such that light having a wavelength corresponding to one of the plurality of peaks is intensified by interference.

This structure further increases the brightness of the white subpixel while further minimizing degradation of the color purity of the white subpixel.

In the light-emitting device of the above-described structure, the transmissive layer of the white subpixel preferably has three portions having different thicknesses. The emission spectrum of the white-light-emitting material preferably includes three peaks, which are a first peak corresponding to a wavelength of red light, a second peak corresponding to a wavelength of green light, and a third peak corresponding to a wavelength of blue light. With this structure, the utilization efficiency of emitted light can be further increased in the green subpixel.

The light-emitting device according to the above-described aspect preferably further includes a planar element substrate. The light-emitting layer of each of the four subpixels is preferably provided on the element substrate. The color filter of each of the red, green, and blue subpixels is preferably disposed between the light-emitting layer thereof and the element substrate. Each of the red, green, and blue subpixels preferably has a semi-reflective layer, which is transparent and reflective, between the light-emitting layer thereof and the color filter thereof. This structure provides a bottom-emission light-emitting device, in which light emitted from the light-emitting layers is output through the element substrate. The light-emitting device of this structure realizes sufficiently high display quality at low power consumption while avoiding complicating the manufacturing process. In this structure, the semi-reflective layers of the red, green, and blue subpixels may serve as electrodes of these subpixels.

In the light-emitting device of the above-described aspect and the preferable structures, the green and white subpixels are preferably disposed side by side and have a common layer. The light-emitting layer of the green subpixel constitutes a part of the common layer. The light-emitting layer of the white subpixel constitutes a remaining part of the common layer. This structure enables the light-emitting layers of the green and white subpixels to be easily and integrally formed in the manufacturing process.

According to another aspect of the invention, an electronic apparatus includes the light-emitting device of the above-described aspect and the preferable structures. This electronic apparatus provides the same advantages as the light-emitting device mounted thereon.

According to another aspect of the invention, a method for manufacturing a light-emitting device including a plurality of pixels constituting a screen, each of the plurality of pixels including four subpixels, which are a red subpixel, a green subpixel, a blue subpixel, and a white subpixel, wherein the red subpixel has a light-emitting layer formed of a red-light-emitting material that emits red light and extending along the screen, and a color filter provided above the light-emitting layer to transmit red light, wherein the green subpixel has a light-emitting layer formed of a white-light-emitting material that emits white light and extending along the screen, and a color filter provided above the light-emitting layer to transmit green light, wherein the blue subpixel has a light-emitting layer formed of a blue-light-emitting material that emits blue light and extending along the screen, and a color filter provided above the light-emitting layer to transmit blue light, wherein the white subpixel has a light-emitting layer formed of the white-light-emitting material and extending along the screen, and wherein the green and white subpixels are disposed side by side, includes integrally forming the light-emitting layers of the green and white subpixels with the white-light-emitting material on an element substrate extending along the screen.

The light-emitting device manufactured by this method has a sufficiently high utilization efficiency of light emitted from the light-emitting layers of the white, red, and blue subpixels. In this method, the light-emitting layers of the green and white subpixels are integrally formed. Accordingly, this method enables manufacturing of the light-emitting device capable of realizing sufficiently high display quality at low power consumption while avoiding complicating the manufacturing process.

According to another aspect of the invention, a method for manufacturing a light-emitting device including a planar element substrate and a plurality of pixels constituting a screen, each of the plurality of pixels including four subpixels, which are a red subpixel, a green subpixel, a blue subpixel, and a white subpixel, wherein the red subpixel has a light-emitting layer formed of a red-light-emitting material that emits red light and extending along the screen, and a color filter provided above the light-emitting layer to transmit red light, wherein the green subpixel has a light-emitting layer formed of a white-light-emitting material that emits white light and extending along the screen, and a color filter provided above the light-emitting layer to transmit green light, wherein the blue subpixel has a light-emitting layer formed of a blue-light-emitting material that emits blue light and extending along the screen, and a color filter provided above the light-emitting layer to transmit blue light, wherein the white subpixel has a light-emitting layer formed of the white-light-emitting material and extending along the screen, wherein the light-emitting layer of each of the four subpixels is provided on the element substrate, wherein the light-emitting layer of each of the red, green, and blue subpixels is disposed between the color filter thereof and the element substrate, wherein each of the four subpixels has a transmissive layer that transmits light provided between the light-emitting layer thereof and the element substrate, wherein the white subpixel has a reflective layer that reflects light provided between the transmissive layer thereof and the element substrate, and wherein the transmissive layer of the white subpixel has a plurality of portions having different thicknesses, includes forming a subtransmissive layer that covers an area of the white subpixel parallel with the element substrate with a transparent material and removing a part of the subtransmissive layer. The forming and the removing are performed alternately.

The light-emitting device manufactured by this method has a sufficiently high utilization efficiency of light emitted from the light-emitting layers of the white, red, and blue subpixels. Because this method allows the use of etching, fine structures that are difficult to form with a deposition mask, i.e., the portions having different thicknesses in the transmissive layer of the white subpixel, can be formed. Thus, the light-emitting device manufactured by this method increases the brightness of the white subpixel while minimizing degradation of the color purity of the white subpixel. Accordingly, this method enables manufacturing of a light-emitting device capable of realizing sufficiently high display quality at low power consumption while avoiding complicating the manufacturing process.

BRIEF DESCRIPTION OF THE DRAWINGS

The invention will be described with reference to the accompanying drawings, wherein like numbers reference like elements.

FIG. 4 is a graph showing the utilization efficiencies of emitted light in a red subpixel 1R and a blue subpixel 1B of the light-emitting device 10.

FIG. 5 is a graph showing the utilization efficiency of emitted light in a green subpixel 1G of the light-emitting device 10.

DESCRIPTION OF EXEMPLARY EMBODIMENTS

Figure 1:
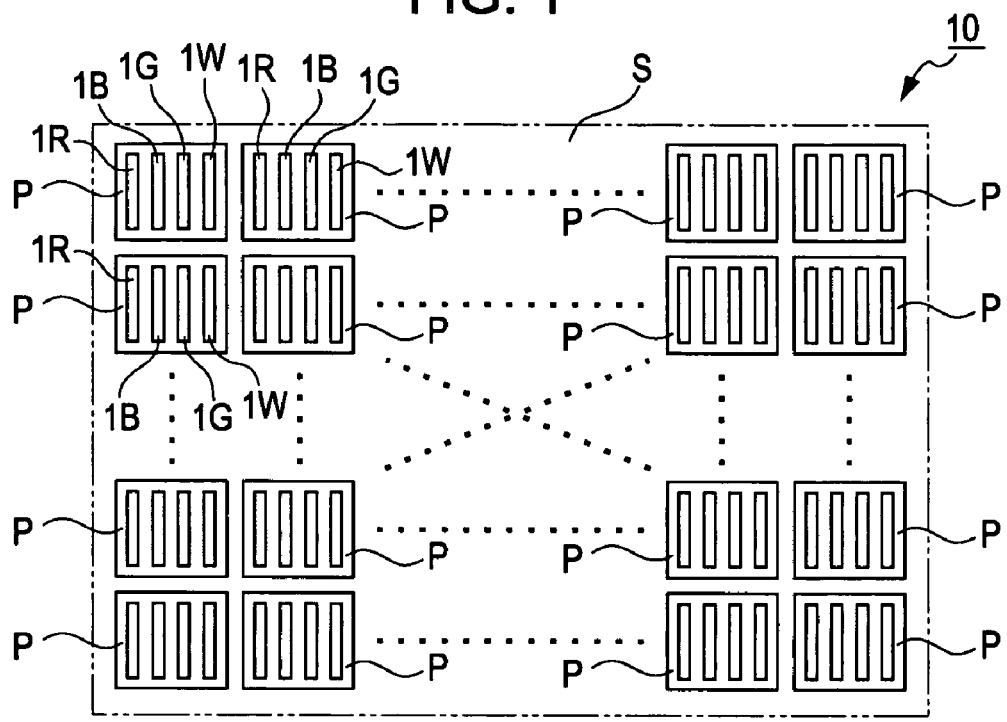
FIG. 1 is a plan view of a light-emitting device 10 according to a first embodiment of the invention.

Embodiments of the present invention will now be described with reference to the accompanying drawings. The layers and components in the drawings are not necessarily to scale.

First Embodiment

FIG. 1 is a plan view of a light-emitting device 10 according to a first embodiment of the invention. The light-emitting device 10 is a full-color display device including a plurality of pixels P that constitute a rectangular screen S. The pixels P are arranged in a matrix on the screen S. Each of the pixels P includes four subpixels 1 that also constitute the screen S. The four subpixels 1 include a red subpixel 1R that emits red light to display red, a green subpixel 1G that emits green light to display green, a blue subpixel 1B that emits blue light to display blue, and a white subpixel 1W that emits white light to display white. These subpixels 1 are aligned in a stripe pattern on the screen S. In each of the pixels P, the green subpixel 1G and the white subpixel 1W are disposed side by side, i.e., disposed in an adjoining manner.

Figure 2:
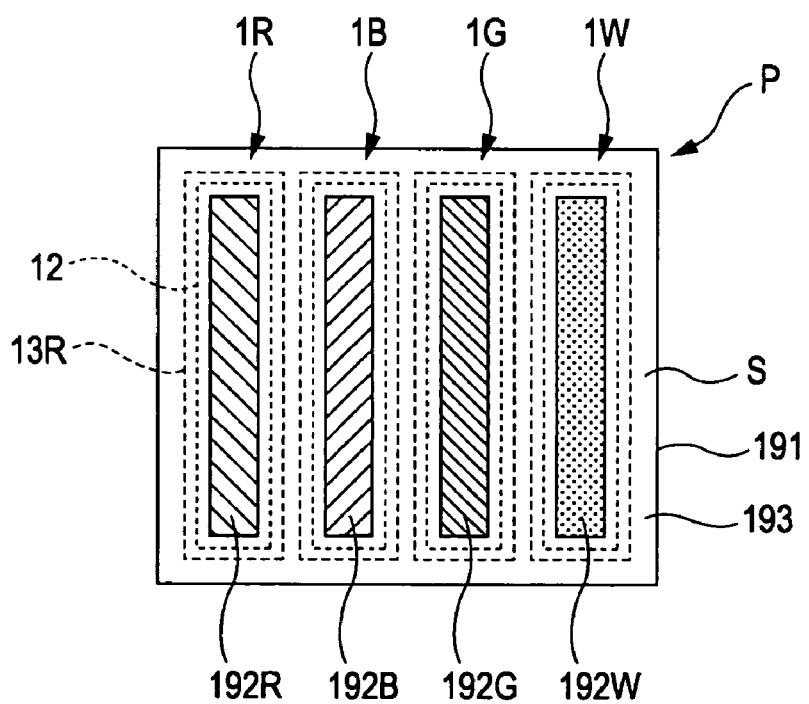
FIG. 2 is a plan view of a pixel P included in the light-emitting device 10.
Figure 3:
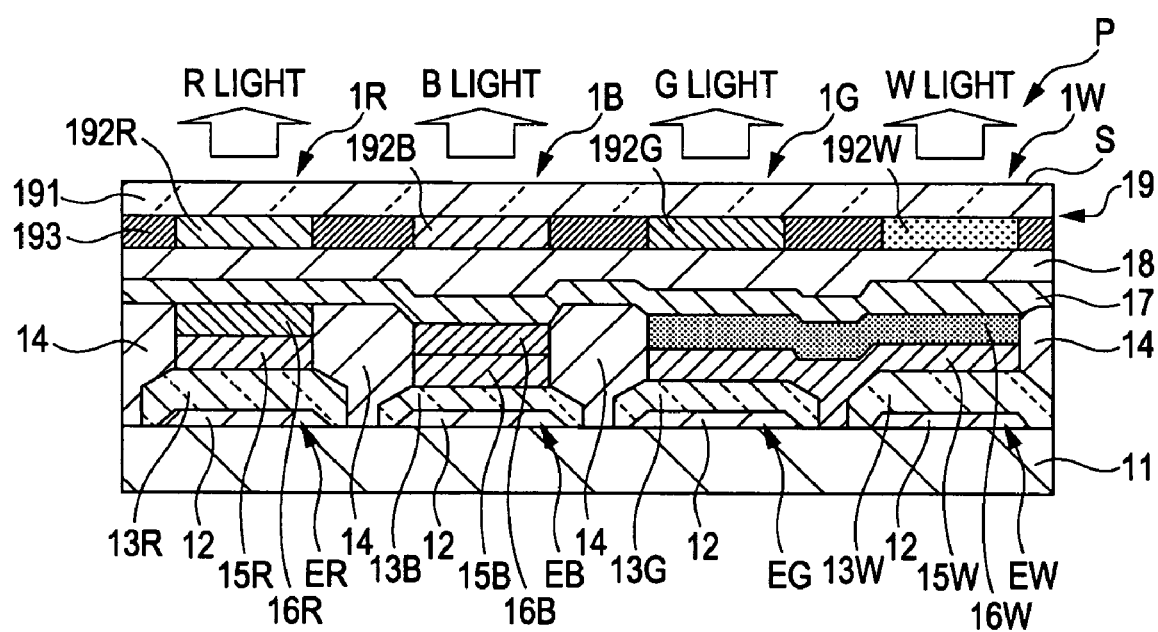
FIG. 3 is a sectional view of the pixel P.

FIG. 2 is a plan view of the pixel P included in the light-emitting device 10, and FIG. 3 is a sectional view of the pixel P. In FIGS. 2 and 3, the same components are hatched with the same patterns. Referring to FIG. 3, the light-emitting device 10 has an element substrate 11. The element substrate 11 is a planar substrate, on which a plurality of light-emitting elements E are disposed. The light-emitting elements E are organic EL elements. Each of the light-emitting elements E corresponds to one of the subpixels 1 and constitutes a part of the subpixel 1. Specifically, the red subpixel 1R includes a red-light-emitting element ER, the green subpixel 1G includes a green-light-emitting element EG, the blue subpixel 1B includes a blue-light-emitting element EB, and the white subpixel 1W includes a white-light-emitting element EW.

The element substrate 11 is formed of, for example, glass, ceramic, or metal, on which active elements such as thin-film transistors (TFTS) can be disposed. Reflective layers 12 that totally reflect light are provided on the element substrate 11 so as to correspond to the subpixels 1. The reflective layers 12 may be formed of, for example, silver, aluminum, silver alloy, aluminum alloy, or silver aluminum alloy. A passivation layer (not shown) is provided on the element substrate 11 and the reflective layers 12. The passivation layer has a thickness of 200 nm and is formed of silicon nitride, for example. The light-emitting elements E are provided on the element substrate 11 and the reflective layers 12, i.e., on the passivation layer, so as to correspond to the subpixels 1. Detailed description will be made below.

Transparent electrodes (transmissive layers) 13 formed of a transparent material such as indium tin oxide (ITO) are provided on the element substrate 11 and the reflective layers 12, i.e., on the passivation layer, so as to correspond to the subpixels 1 and to cover the reflective layers 12. The pixel P includes four transparent electrodes 13, namely, the red transparent electrode 13R, the green transparent electrode 13G, the blue transparent electrode 13B, and the white transparent electrode 13W, whose thicknesses are, for example, 130 nm, 110 nm, 85 nm, and any thickness in the range of 70 nm to 130 nm, respectively. Although these transparent electrodes 13 serve as positive electrodes of the light-emitting elements E in the embodiment, they may serve as negative electrodes in a modification of the embodiment.

Partitions 14, which define organic-layer regions for all of the light-emitting elements E with the transparent electrodes 13, are provided on the element substrate 11 and the transparent electrodes 13, i.e., on the passivation layer and the transparent electrodes 13. The pixel P includes three organic-layer regions. One of these organic-layer regions is for the red-light-emitting element ER, in which the red transparent electrode 13R, a red hole-injection layer 15R, a red-light-emitting layer 16R, and a red electron-injection layer (not shown) are provided in sequence from the bottom. Another of these organic-layer regions is for the blue-light-emitting element EB, in which the blue transparent electrode 13B, a blue hole-injection layer 15B, a blue-light-emitting layer 16B, and a blue electron-injection layer (not shown) are provided in sequence from the bottom. The rest of these organic-layer regions is shared by the green-light-emitting element EG and the white-light-emitting element EW, in which the green transparent electrode 13G and the white transparent electrode 13W, a white hole-injection layer 15W, a white-light-emitting layer 16W, and a white electron-injection layer (not shown) are provided in sequence from the bottom.

In the pixel P, the white-light-emitting layer 16W is a common layer shared by the green subpixel 1G and the white subpixel 1W. The white-light-emitting layer 16W serves as the light-emitting layer of the green subpixel 1G at one part, and serves as the light-emitting layer of the white subpixel 1W at the remaining part. The light-emitting layers 16 (the light-emitting layers 16R, 16B, and 16W) are provided on the screen S (the element substrate 11), and have a thickness of, for example, 30 nm. The hole-injection layers 15 (the hole-injection layers 15R, 15B, and 15W) have a thickness of, for example, 80 nm. The electron-injection layers have a thickness of, for example, 20 nm. Organic functional layers that do not emit light by themselves, such as the hole-injection layer and a hole-transporting layer, may be provided as common layers shared by all the pixels.

As described above, the subpixels 1 in the pixel P include the transmissive layers (the transparent electrodes 13) between the light-emitting layers 16 and the element substrate 11, and the reflective layers 12 between the transmissive layers and the element substrate 11. The red-light-emitting layer 16R is formed of an organic EL material that emits red light (hereinafter referred to as a "red-light-emitting material"), the blue-light-emitting layer 16B is formed of an organic EL material that emits blue light (hereinafter referred to as a "blue-light-emitting material"), and the white-light-emitting layer 16W is formed of an organic EL material that emits white light (hereinafter referred to as a "white-light-emitting material"). The emission spectrum of the white-light-emitting material includes three peaks, in which the wavelength of a first peak corresponds to red light, the wavelength of a second peak corresponds to green light, and the wavelength of a third peak corresponds to blue light.

A common electrode 17 shared by all the light-emitting elements E is provided on the electron-injection layers. The common electrode 17 is a semi-reflective layer, which is transparent and reflective, having a thickness of 10 nm and is formed of a magnesium silver alloy, for example. As described above, the element substrate 11 has the reflective layers 12 and the light-emitting elements E provided thereon so as to correspond to the subpixels 1. At each of the light-emitting elements E, the thickness of the transparent electrode 13 is set such that an optical distance between the common electrode 17 and the reflective layer 12 positioned right below the light-emitting element E intensifies specific color light displayed by the corresponding subpixel 1, among light emitted from the light-emitting layer 16, by interference of light.

A sealing layer 18 is provided on the common electrode 17, which is provided on the element substrate 11, so as to cover all the light-emitting elements E. The sealing layer 18 serves to seal and protect the light-emitting elements E, and is formed of a transparent material such as silicon oxynitride or silicon oxide. The sealing layer 18 is bonded with a color filter substrate 19. The color filter substrate 19 includes a transparent substrate 191, which is planar and transparent, color filters 192 (a red color filter 192R, a green color filter 192G, a blue color filter 192B, and a white color filter 192W) provided so as to correspond to the subpixels 1, and a light-blocking black matrix 193.

The color filters 192 are provided below the transparent substrate 191, each of which basically transmits specific color light. For example, the red color filter 192R only transmits red light, the green color filter 192G only transmits green light, and the blue color filter 192B only transmits blue light. In contrast, the white color filter 192W is formed of, for example, a transparent resin and transmits any color light. The black matrix 193 is provided below the transparent substrate 191 and is arranged so as to fill gaps between the color filters 192.

The color filter substrate 19 is in contact with the sealing layer 18 at the surface provided with the color filters 192. In the pixel P, the red color filter 192R overlaps the red-light-emitting layer 16R, the blue color filter 192B overlaps the blue-light-emitting layer 16B, and the green color filter 192G and the white color filter 192W overlap the white-light-emitting layer 16W. In other words, in the pixel P, the light-emitting layers 16 are provided on the element substrate 11 so as to be sandwiched between the element substrate 11 and the color filters 192.

In the pixel P, the red subpixel 1R includes the red-light-emitting layer 16R and the red color filter 192R that overlaps the red-light-emitting layer 16R, the blue subpixel 1B includes the blue-light-emitting layer 16B and the blue color filter 192B that overlaps the blue-light-emitting layer 16B, the green subpixel 1G includes a part of the white-light-emitting layer 16W (which serves as the light-emitting layer of the green-light-emitting element EG) and the green color filter 192G that overlaps the part, and the white subpixel 1G includes the remaining part of the white-light-emitting layer 16W (which serves as the light-emitting layer of the white-light-emitting element EW) and the white color filter 192W that overlaps the remaining part.

As is clear from the foregoing description, the light-emitting device 10 is a top-emission organic EL device. Therefore, light emitted from the light-emitting layers 16 is output in a direction away from the element substrate, i.e., through the color filter substrate 19. Because light emitted from the light-emitting layers 16 passes through the color filters 192, the light emitted from the red subpixel 1R (R light) is red, the light emitted from the blue subpixel 1B (B light) is blue, and the light emitted from the green subpixel 1G (G light) is green. Because the color filter 192W is transparent, the light emitted from the white subpixel 1W (W light) is white.

As described above, the light-emitting device 10 includes the pixels P, each of which includes four subpixels, namely, the red subpixel 1R, the green subpixel 1G, the blue subpixel 1B, and the white subpixel 1W. The red subpixel 1R includes the red-light-emitting layer 16R formed of the red-light-emitting material, and the red color filter 192R that overlaps the red-light-emitting layer 16R. The green subpixel 1G includes a part of the white-light-emitting layer 16W formed of the white-light-emitting material, and the green color filter 192G that overlaps the part. The blue subpixel 1B includes the blue-light-emitting layer 16B formed of the blue-light-emitting material, and the blue color filter 192B that overlaps the blue-light-emitting layer 16B. The white subpixel 1W includes the remaining part of the white-light-emitting layer 16W. Because the light-emitting device 10 has a sufficiently high utilization efficiency of light emitted from the light-emitting layers 16 in each of the white subpixel 1W, the red subpixel 1R, and the blue subpixel 1B, sufficiently high display quality can be realized at low power consumption. Further, the light-emitting layers of the green subpixel 1G and the white subpixel 1W are formed of the same material, namely, the white-light-emitting material. Accordingly, the light-emitting layers 16 can be formed of three types of materials (the red-, blue-, and white-light-emitting materials). Thus, the light-emitting device 10 does not complicate the manufacturing process. Thus, the light-emitting device 10 realizes sufficiently high display quality at low power consumption while avoiding complicating the manufacturing process.

As described above, the light-emitting device 10 is a top-emission organic EL device having the element substrate 11. In the subpixels 1 of the pixel P, the light-emitting layers 16 are provided on the element substrate 11 so as to be sandwiched between the element substrate 11 and the color filters 192. The subpixels 1 of the pixel P include the transmissive layers (the transparent electrodes 13) between the light-emitting layers 16 and the element substrate 11, and the reflective layers 12 between the transmissive layers and the element substrate 11. At each of the light-emitting elements E, the thickness of the transparent electrode 13 is set such that an optical distance between the common electrode 17 and the reflective layer 12 positioned right below the light-emitting element E intensifies specific color light displayed by the corresponding subpixel 1, among light emitted from the light-emitting layer 16, by interference of light. Accordingly, with the light-emitting device 10, the brightness of the subpixels 1 can be increased.

FIG. 4 is a graph showing the utilization efficiencies of emitted light in the red subpixel 1R and the blue subpixel 1B of the light-emitting device 10. The graph shows the emission spectra of the light-emitting layers 16, the transmission characteristics of the color filters 192, and the emission spectra of the color filters 192 (R light and B light) with respect to the red subpixel 1R and the blue subpixel 1B. The graph shows that the utilization efficiencies of emitted light in the red subpixel 1R and the blue subpixel 1B are about 60% to 80%, which are sufficiently high. Because red and blue are less easily perceived in human vision than green, sufficiently high utilization efficiencies of emitted light in the red subpixel 1R and the blue subpixel 1B lead directly to a reduction in power consumption.

FIG. 5 is a graph showing the utilization efficiency of emitted light in the green subpixel 1G of the light-emitting device 10. The graph shows the emission spectrum of the light-emitting layer 16, the transmission characteristic of the color filter 192G, and the emission spectrum of the color filter 192G (G light), with respect to the green subpixel 1G. The graph shows that the utilization efficiency of emitted light is about 50% in the green subpixel 1G, which is sufficiently high. This is partly because a peak of the emission spectrum of the white-light-emitting material, which constitutes a part of the light-emitting layer of the green subpixel 1G, corresponds to the wavelength of green light.

A method for manufacturing the light-emitting device 10 will now be described.

Figure 6:
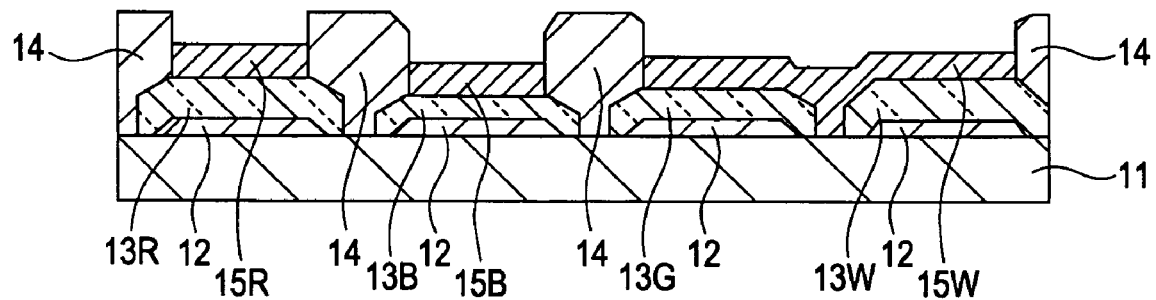
FIG. 6 is a sectional view showing a first step of manufacturing the light-emitting device 10.

Referring to FIG. 6, the reflective layers 12 are formed on the element substrate 11 so as to correspond to the subpixels 1. The passivation layer (not shown) is formed on the element substrate 11 and the reflective layers 12. The transparent electrodes 13 are formed thereon so as to cover the reflective layer 12 and so as to correspond to the subpixels 1. The partitions 14 are formed on the passivation layer (not shown) and the transparent electrodes 13 so as to define the organic-layer regions for all the light-emitting elements E. The hole-injection layers 15 are formed in the organic-layer regions by deposition or application. The hole-transporting layers may be formed on the hole-injection layers, if necessary.

In forming the transparent electrodes 13, the thicknesses thereof need to be set in accordance with the types of the subpixels 1. The thicknesses of the transparent electrodes 13 can be controlled by, for example, repeated deposition using masks. Three types of materials are used in forming the hole-injection layers 15. The red hole-injection layer 15R is formed in the organic-layer region of the red-light-emitting element ER, the blue hole-injection layer 15B is formed in the organic-layer region of the blue-light-emitting element EB, and the white hole-injection layer 15W is formed in the organic-layer region shared by the green-light-emitting element EG and the white-light-emitting element EW. Because the hole-injection layers can often be shared, they may be formed as a common layer for all the light-emitting elements.

Figure 7:
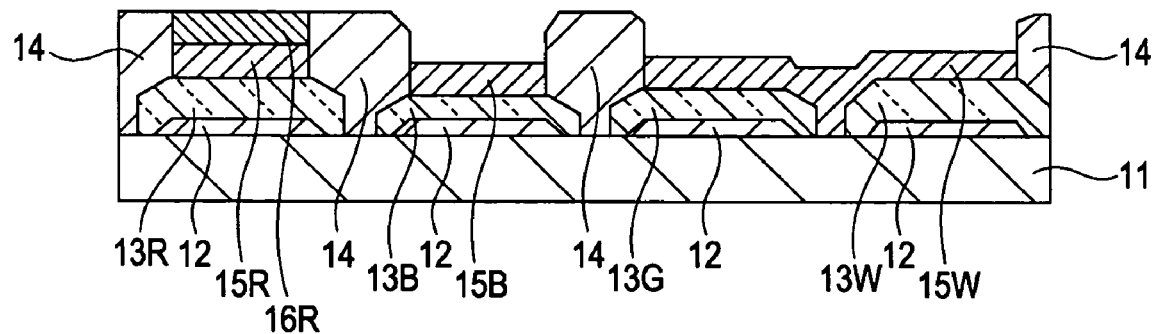
FIG. 7 is a sectional view showing a manufacturing step subsequent to the step shown in FIG. 6.
Figure 8:
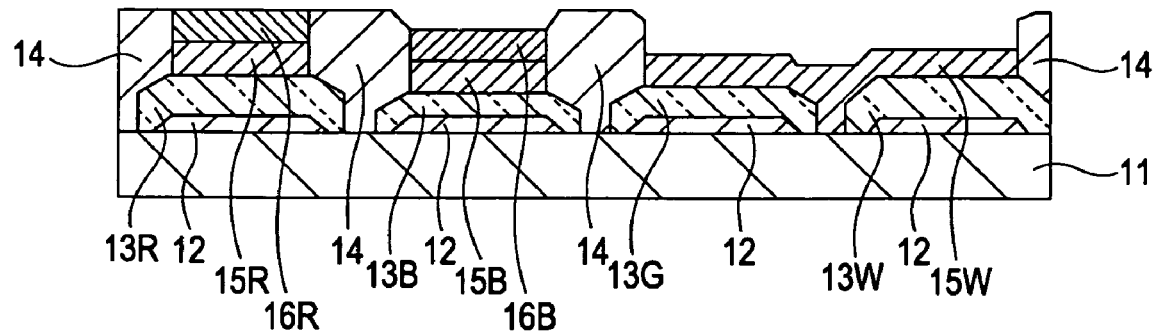
FIG. 8 is a sectional view showing a manufacturing step subsequent to the step shown in FIG. 7.
Figure 9:
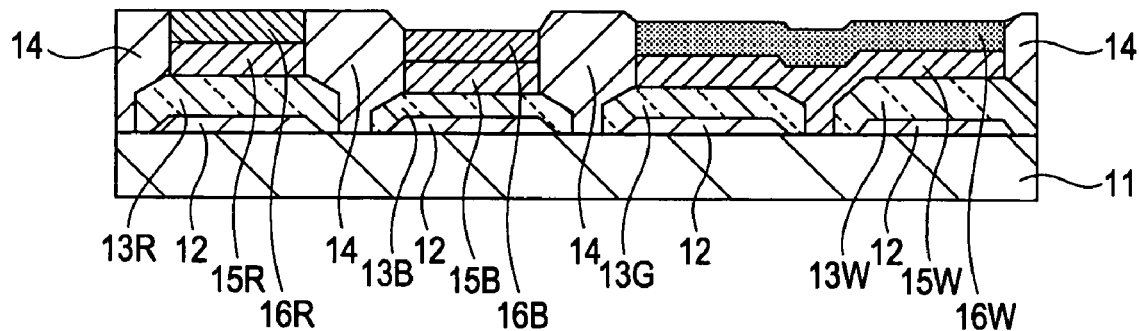
FIG. 9 is a sectional view showing a manufacturing step subsequent to the step shown in FIG. 8.

Referring to FIG. 7, in each of the pixels P, the red-light-emitting layer 16R is formed in the organic-layer region of the red-light-emitting element ER by depositing or applying the red-light-emitting material. Referring to FIG. 8, in each of the pixels P, the blue-light-emitting layer 16B is formed in the organic-layer region of the blue-light-emitting element EB by depositing or applying the blue-light-emitting material. Referring to FIG. 9, in each of the pixels P, the white-light-emitting layer 16W is formed in the organic-layer region shared by the green-light-emitting element EG and the white-light-emitting element EW by depositing or applying the white-light-emitting material. That is, three types of materials are used in forming the light-emitting layers 16. In forming the white-light-emitting layer 16W, the light-emitting layers of the green subpixel 1G and the white subpixel 1W are integrally formed of the white-light-emitting material.

Figure 10:
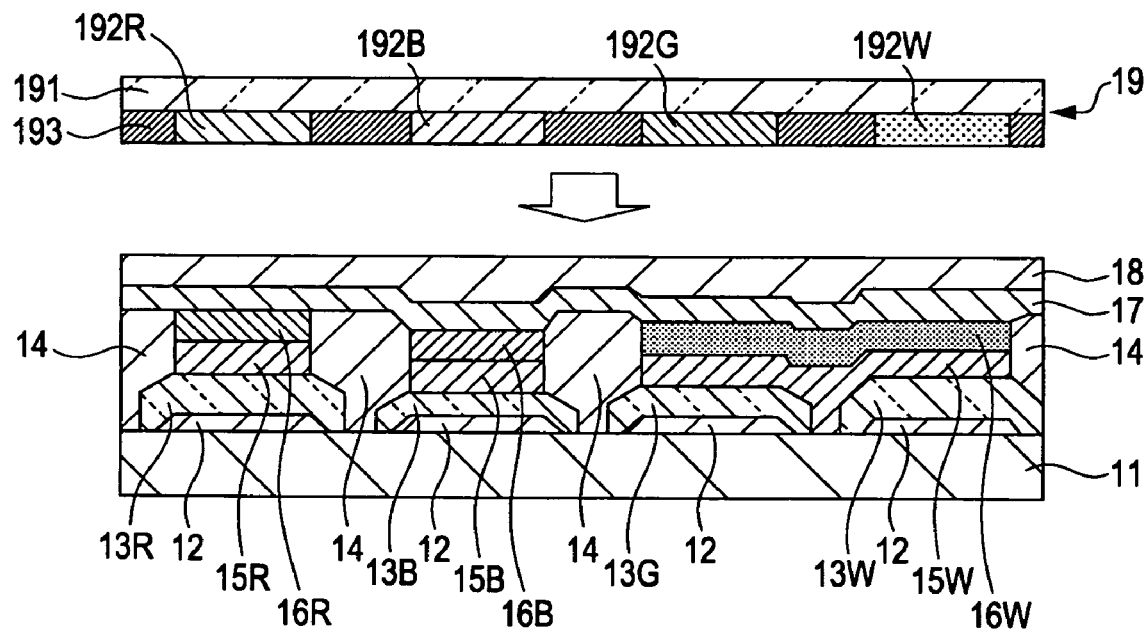
FIG. 10 is a sectional view showing a manufacturing step subsequent to the step shown in FIG. 9.

Referring to FIG. 10, the electron-injection layers (not shown) are formed in the organic-layer regions by deposition or application. The common electrode 17 is formed on the electron-injection layers and the partitions 14. Then, the sealing layer 18 is formed on the common electrode 17, which is provided on the element substrate 11, and the color filter substrate 19 is bonded thereto. The light-emitting device 10 as shown in FIG. 3 is thus completed. As has been described, the light-emitting device 10 according to an embodiment of the invention will not complicate the manufacturing process.

Second Embodiment

Figure 11:
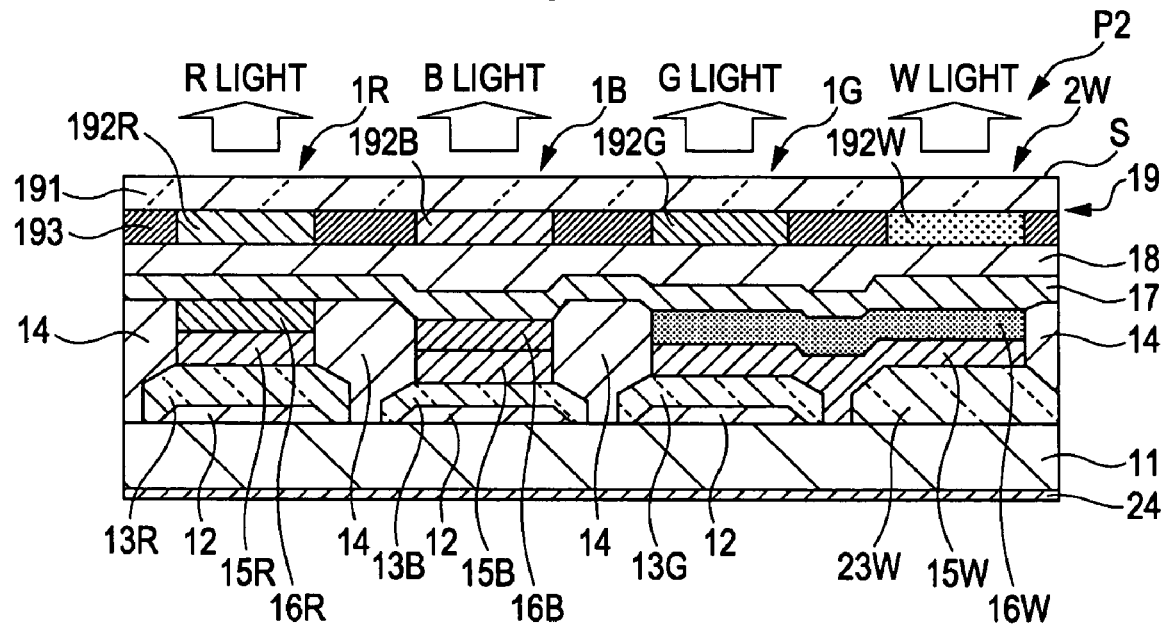
FIG. 11 is a sectional view of a pixel P2 included in a light-emitting device according to a second embodiment of the invention.

FIG. 11 is a sectional view of a pixel P2 included in a light-emitting device according to a second embodiment of the invention. The pixel P2 corresponds to the pixel P included in the light-emitting device 10. The light-emitting device in FIG. 11 differs from the light-emitting device 10 in that the former includes a white subpixel 2W in place of the white subpixel 1W, and a light-absorbing layer 24 that absorbs light and underlies the element substrate 11, and in that the material for the element substrate 11 is limited to a transparent material such as glass. The white subpixel 2W differs from the white subpixel 1W in that the white subpixel 2W does not include the reflective layer 12 but includes a white transparent electrode 23W in place of the white transparent electrode 13W. The white transparent electrode 23W differs from the white transparent electrode 13W only in shape. This difference is attributed to the absence of the reflective layer 12. The white transparent electrode 23W may be made of a light-blocking material.

This light-emitting device, in which the white subpixel 2W does not include the reflective layer 12, rarely causes a problem that light of specific wavelength emitted from the light-emitting layer of the white subpixel 2W is intensified by interference. Accordingly, this light-emitting device can suppress degradation in the color purity of the white subpixel 2W. Further, in this light-emitting device, redundant light is absorbed by the light-absorbing layer 24, whereby the contrast of the white subpixel 2W is not reduced in spite of the transparent element substrate 11. In the second embodiment, a white-light-emitting material whose emission spectrum includes one or zero peak may be used.

Third Embodiment

Figure 12:
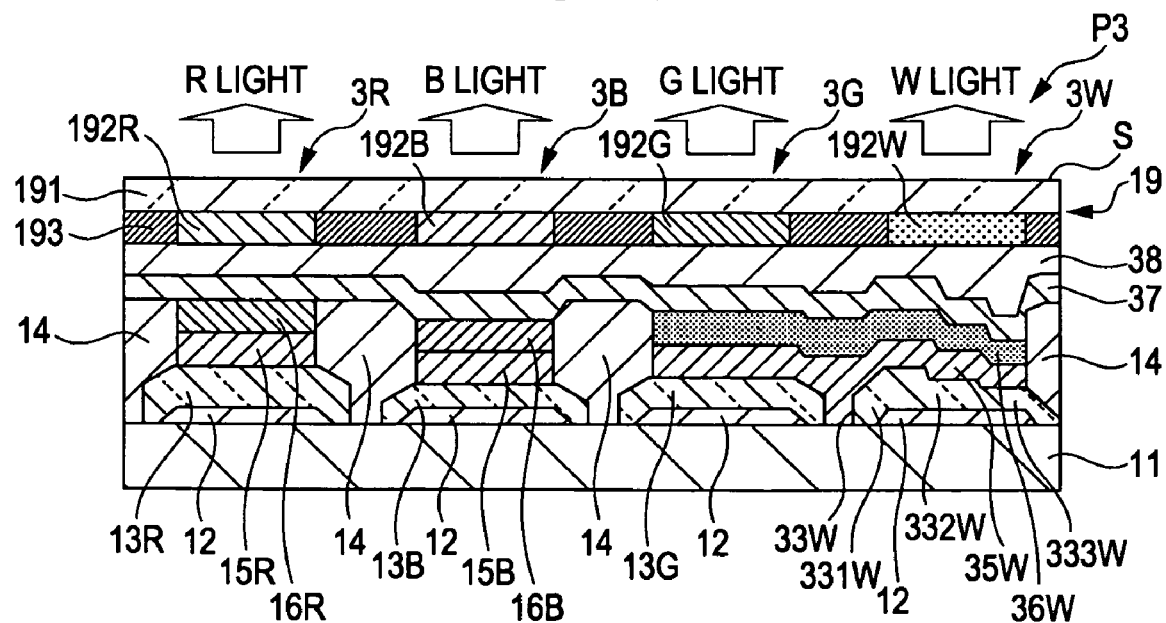
FIG. 12 is a sectional view of a pixel P3 included in a light-emitting device according to a third embodiment of the invention.
Figure 13:
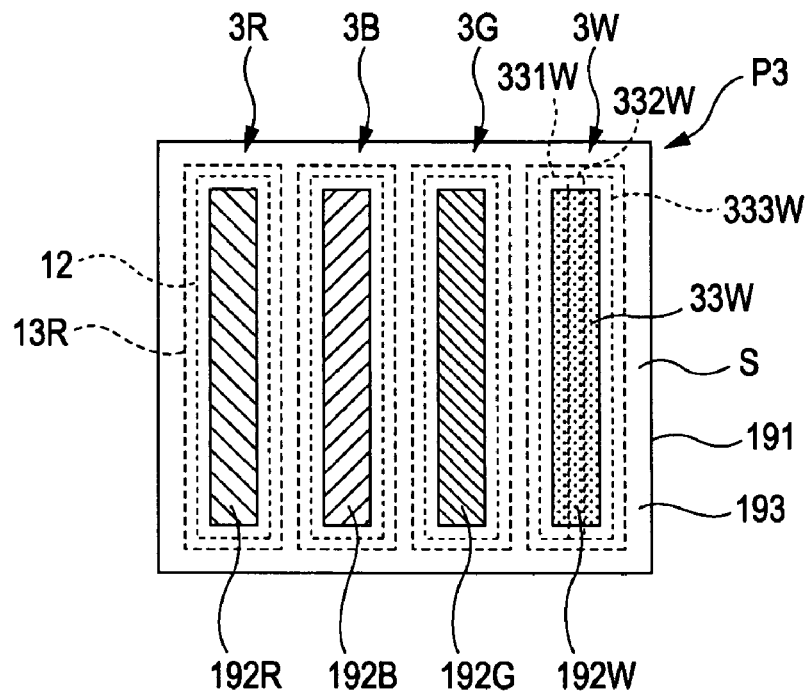
FIG. 13 is a plan view of the pixel P3.

FIG. 12 is a sectional view of a pixel P3 included in a light-emitting device according to a third embodiment of the invention. FIG. 13 is a plan view of the pixel P3. The pixel P3 corresponds to the pixel P included in the light-emitting device 10. The light-emitting device in FIGS. 12 and 13 differs from the light-emitting device 10 in that the pixel P3 includes a red subpixel 3R, a blue subpixel 3B, a green subpixel 3G, and a white subpixel 3W in place of the red subpixel 1R, the blue subpixel 1B, the green subpixel 1G, and the white subpixel 1W.

The green subpixel 3G and the white subpixel 3W differ from the green subpixel 1G and the white subpixel 1W significantly in that the white subpixel 3W includes a white transparent electrode (transmissive layer) 33W in place of the white transparent electrode 13W. The white transparent electrode 33W differs from the white transparent electrode 13W in that it has portions 331W, 332W, and 333W having different thicknesses. The thickness of each of the portions 331W, 332W, and 333W is set such that light corresponding to the wavelength of one of the three peaks in the emission spectrum of the white-light-emitting material is intensified by interference. More specifically, the thickness of the portion 331W is set such that the red light is intensified by interference, the thickness of the portion 332W is set such that the green light is intensified by interference, and the thickness of the portion 333W is set such that the blue light is intensified by interference.

In the embodiment, because of the difference in shape of the white transparent electrode 33W and the white transparent electrode 13W, the shapes of the white hole-injection layer, the white-light-emitting layer, the electron-injection layer (not shown), the common electrode, and the sealing layer are different from corresponding ones of the first embodiment. This is why the pixel P3 includes the red subpixel 3R, the blue subpixel 3B, and the green subpixel 3G in place of the red subpixel 1R, the blue subpixel 1B, and the green subpixel 1G.

In this light-emitting device, light of specific wavelength emitted from the light-emitting layer of the white subpixel 3W is intensified by interference. Therefore, with this light-emitting device, the brightness can be increased in the white subpixel 3W. Especially in the white subpixel 3W, light corresponding to all of the three peak wavelengths (red, green, and blue light) in the emission spectrum of the light-emitting layer is intensified by interference of light. This suppresses the occurrence of the problem that light having specific wavelength is intensified by interference. Accordingly, this light-emitting device can suppress degradation in the color purity of the white subpixel 3W.

Next, a method for manufacturing this light-emitting device will be described.

Figure 14:
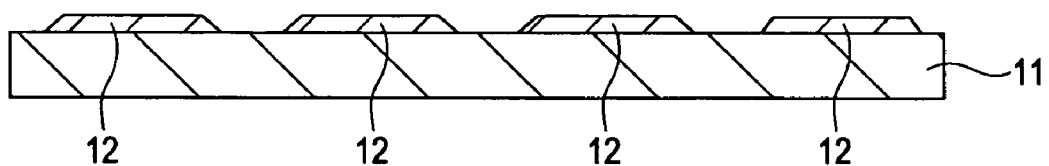
FIG. 14 is a sectional view showing a first step of manufacturing the light-emitting device according to the third embodiment of the invention.
Figure 15:
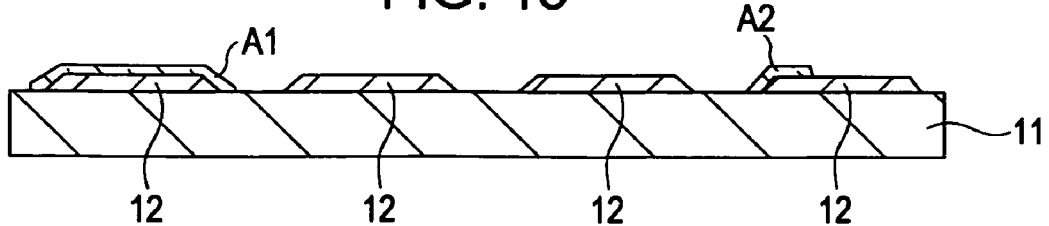
FIG. 15 is a sectional view showing a manufacturing step subsequent to the step shown in FIG. 14.
Figure 16:
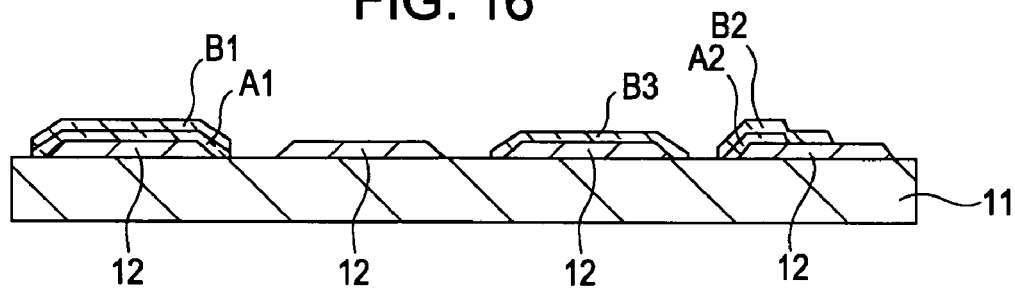
FIG. 16 is a sectional view showing a manufacturing step subsequent to the step shown in FIG. 15.
Figure 17:
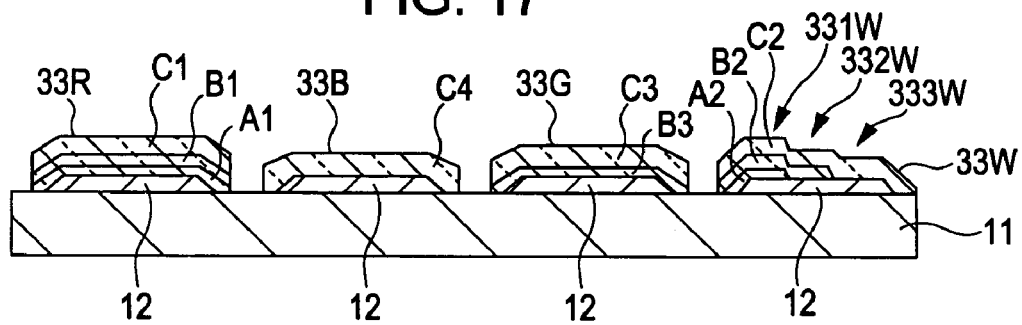
FIG. 17 is a sectional view showing a manufacturing step subsequent to the step shown in FIG. 16.

Referring to FIG. 14, the reflective layers 12 are formed on the element substrate 11 so as to correspond to the subpixels 3. A passivation layer (not shown) is formed over the element substrate 11 and the reflective layers 12. Referring to FIGS. 15 to 17, the transparent electrodes 33 are formed on the passivation layer (not shown) so as to correspond to the subpixels 3 and cover the reflective layers 12.

The transparent electrodes 33 are formed as follows.

Referring to FIG. 15, a material (transparent material) for forming the transparent electrodes 33 is provided on the passivation layer (not shown) to form subtransmissive layers A1 and A2 integrally. Specifically, a subtransmissive layer having a thickness of A is formed so as to cover all the reflective layers 12 (a formation step), and unnecessary portions of the subtransmissive layer are removed by etching (a removal step). The remaining portions are the subtransmissive layers A1 and A2. The subtransmissive layer A1 covers the reflective layer 12 of the red subpixel 3R. The subtransmissive layer A2 covers a part of the reflective layer 12 of the white subpixel 3W (an area parallel with the element substrate 11 in the white subpixel 3W).

Referring to FIG. 16, the material for forming the transparent electrodes 33 is provided on the resultant structure to form subtransmissive layers B1 to B3 integrally. Specifically, a subtransmissive layer having a thickness of B is formed so as to cover all the reflective layers 12, and unnecessary portions of the subtransmissive layer are removed by etching. The remaining portions are the subtransmissive layers B1 to B3. The subtransmissive layer B1 covers the reflective layer 12 of the red subpixel 3R. The subtransmissive layer B2 covers a part of the reflective layer 12 of the white subpixel 3W (an area parallel with the element substrate 11 in the white subpixel 3W). The subtransmissive layer B3 covers the reflective layer 12 of the green subpixel 3G.

Referring to FIG. 16, the material for forming the transparent electrodes 33 is provided on the resultant structure to form subtransmissive layers C1 to C4 integrally. Specifically, a subtransmissive layer having a thickness of C is formed so as to cover all the reflective layers 12, and unnecessary portions of the subtransmissive layer are removed by etching. The remaining portions are the subtransmissive layers C1 to C4. The subtransmissive layer C1 covers the reflective layer 12 of the red subpixel 3R. The subtransmissive layer C2 covers a part of the reflective layer 12 of the white subpixel 3W (an area parallel with the element substrate 11 in the white subpixel 3W). The subtransmissive layer C3 covers the reflective layer 12 of the green subpixel 3G. The subtransmissive layer C4 covers the reflective layer 12 of the blue subpixel 3B.

In this manner, all the transparent electrodes 33 are formed.

As is clear from the above description, the red transparent electrode 33R has a thickness of A+B+C, the green transparent electrode 33G has a thickness of B+C, and the blue transparent electrode 33B has a thickness of C. The white transparent electrode 33W has a thickness of A+B+C in the portion 331W, a thickness of B+C in the portion 332W, and a thickness of C in the portion 333W. That is, in forming the subtransmissive layers, when ideal thicknesses of the red, green, and blue transparent electrodes 33R, 33G, and 33B are defined as X, Y, and Z, respectively, the thicknesses A, B, and C are set as A=X−Y, B=Y−Z, and C=Z−0=Z. In other words, the thickness of the subtransmissive layer formed in the n-th order is equal to the difference between the thickness of the n-th thickest transparent electrode 33 and the thickness of the n+1-th thickest transparent electrode 33. It should be noted that the thickness of a nonexistent subtransmissive layer is regarded as 0.

The method for manufacturing the light-emitting device according to the third embodiment includes the formation step in which a subtransmissive layer covering an area parallel with the element substrate 11 in the white subpixel 3W is formed with a transparent material and the removal step in which a part of the subtransmissive layer is removed, which are performed alternately. Therefore, this light-emitting device enables formation of a fine structure that is difficult to form using a deposition mask, i.e., the portions 331W, 332W, and 333W having different thicknesses in the white transparent electrode 33W of the white subpixel 3W.

Fourth Embodiment

Figure 18:
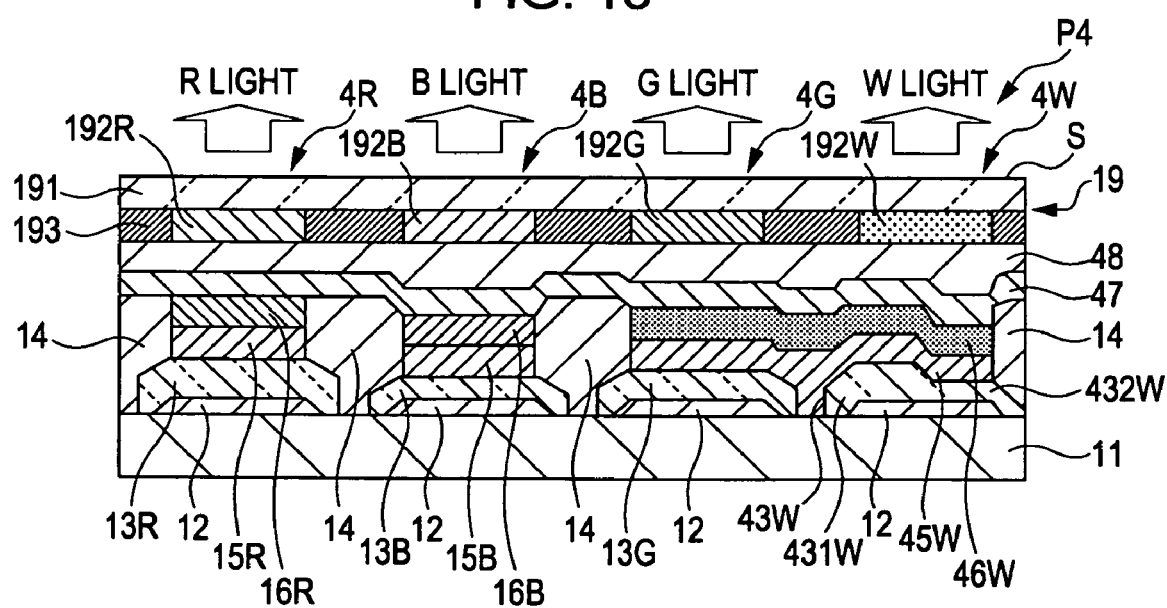
FIG. 18 is a sectional view of a pixel P4 included in a light-emitting device according to a fourth embodiment of the invention.

FIG. 18 is a sectional view of a pixel P4 of a light-emitting device according to a fourth embodiment of the invention. The pixel P4 corresponds to the pixel P in the light-emitting device 10. The light-emitting device shown in FIG. 18 includes a red subpixel 4R, a blue subpixel 4B, a green subpixel 4G, and a white subpixel 4W in place of the red subpixel 1R, the blue subpixel 1B, the green subpixel 1G, and the white subpixel 1W of the light-emitting device 10.

The green subpixel 4G and the white subpixel 4W differ from the green subpixel 1G and the white subpixel 1W significantly in that the white subpixel 4W includes a white transparent electrode (transmissive layer) 43W in place of the white transparent electrode 13W, and in that a white-light-emitting layer 46W is provided in place of the white-light-emitting layer 16W. The white transparent electrode 43W differs from the white transparent electrode 13W in that it has portions 431W and 432W having different thicknesses.

A significant difference between the white-light-emitting layer 46W and the white-light-emitting layer 16W is their material. While the emission spectrum of the material of the white-light-emitting layer 16W includes three peaks, the emission spectrum of the material of the white-light-emitting layer 46W (white-light-emitting material) includes two peaks. Of these two peaks, the light having the wavelength corresponding to a first peak is orange light, and the light having the wavelength corresponding to a second peak is sky blue light.

The thickness of each of the portions 431W and 432W is set such that light corresponding to the wavelength of one of the two peaks in the emission spectrum of the white-light-emitting material is intensified by interference. More specifically, the thickness of the portion 431W is set such that the orange light is intensified by interference, and the thickness of the portion 432W is set such that the sky blue light is intensified by interference.

In the embodiment, because of the difference in shape of the white transparent electrode 43W and the white transparent electrode 13W, the shapes of the white hole-injection layer, the white-light-emitting layer, the electron-injection layer (not shown), the common electrode, and the sealing layer are different from corresponding ones of the first embodiment. This is why the pixel P4 includes the red subpixel 4R and the blue subpixel 4B in place of the red subpixel 1R and the blue subpixel 1B.

With this light-emitting device, the brightness of the white subpixel 4W can be increased and lowering of the color purity of the white subpixel 4W can be avoided.

Figure 19:
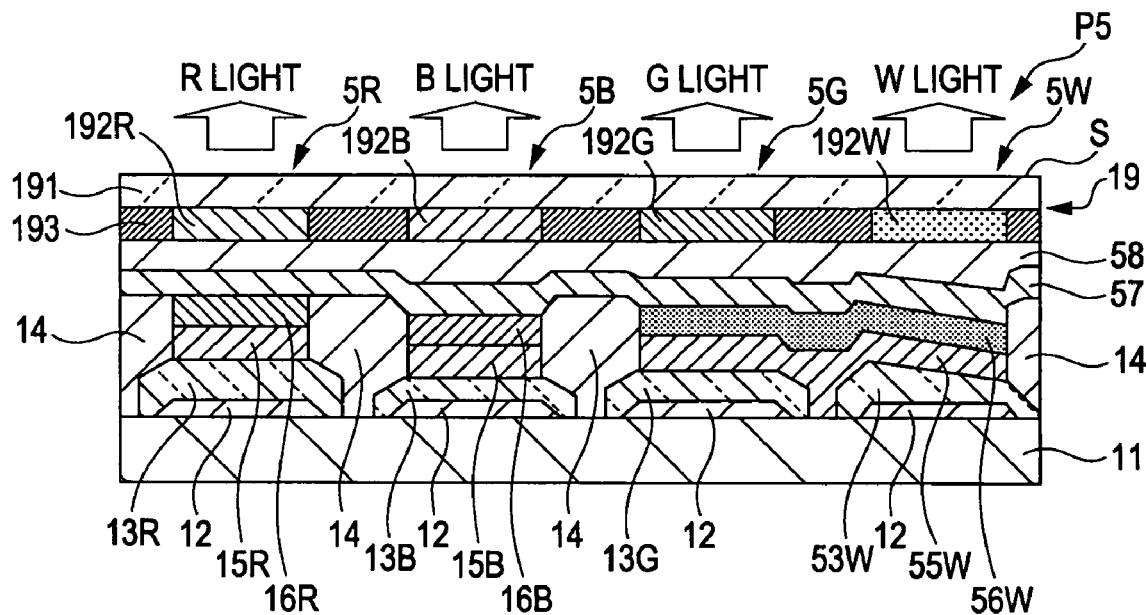
FIG. 19 is a schematic view of a pixel P5, which is a modification of the pixel P4.

As is clear from the descriptions in the third and fourth embodiments, in the invention, any type of white-light-emitting material whose emission spectrum includes a plurality of peaks can be used. It is preferable that the number of peaks in the emission spectrum of the white-light-emitting material equal the number of portions having different thicknesses in the white transparent electrode. Accordingly, if the emission spectrum of the white-light-emitting material includes many peaks, the shape of the white transparent electrode eventually becomes tapered as a pixel P5, which is schematically shown in FIG. 19. The pixel P5, a red subpixel 5R, a blue subpixel 5B, a green subpixel 5G, a white subpixel 5W, a white transparent electrode 53W, a white hole-injection layer 55W, a white-light-emitting layer 56, a common electrode 57, and a sealing layer 58 shown in FIG. 19 correspond to the pixel P4, the red subpixel 4R, the blue subpixel 4B, the green subpixel 4G, the white subpixel 4W, the white transparent electrode 43W, the white hole-injection layer 45W, the white-light-emitting layer 46, the common electrode 47, and the sealing layer 48 shown in FIG. 18, respectively.

Fifth Embodiment

Figure 20:
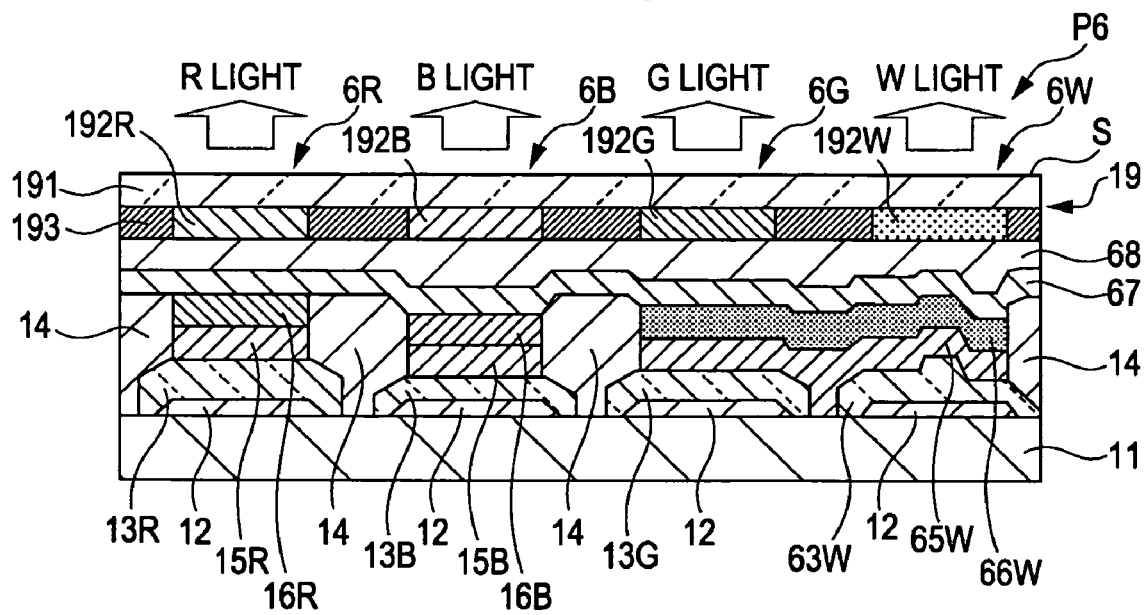
FIG. 20 is a sectional view of a pixel P6 according to a fifth embodiment of the invention.

FIG. 20 is a sectional view of a pixel P6 of a light-emitting device according to a fifth embodiment of the invention. The pixel P6 corresponds to the pixel P3 in FIG. 12. The pixel P6 has a red subpixel 6R, a blue subpixel 6B, a green subpixel 6G, and a white subpixel 6W in place of the red subpixel 3R, the blue subpixel 3B, the green subpixel 3G, and the white subpixel 3W of the pixel P3.

The white subpixel 6W differs from the white subpixel 3W significantly in that the white subpixel 6W includes a white transparent electrode (transmissive layer) 63W in place of the white transparent electrode 33W. The white transparent electrode 63W includes a portion 631W having the same thickness as the portion 332W, a portion 632W having the same thickness as the portion 331W, and a portion 633W having the same thickness as the portion 333W. While the portion 332W is disposed between the thickest portion 331W and the thinnest portion 333W in the white transparent electrode 33W, the thickest portion 632W is disposed between the other two portions, namely, the portions 631W and 633W in the white transparent electrode 63W.

In the embodiment, because of the difference in shape of the white transparent electrode 63W and the white transparent electrode 33W, the shapes of the white hole-injection layer, the white-light-emitting layer, the electron-injection layer (not shown), the common electrode, and the sealing layer are different from corresponding ones of the third embodiment. This is why the pixel P6 includes the red subpixel 6R, the blue subpixel 6B, and the green subpixel 6G in place of the red subpixel 3R, the blue subpixel 3B, and the green subpixel 3G.

This light-emitting device also provides the same advantages as the light-emitting device of the third embodiment. This shows that, in the invention, the sectional shape of the white transparent electrode is not limited to those shown in the drawings. For example, when there are three portions having different thicknesses, the portions may be arranged so that the thinnest portion is disposed between the other two portions, or so that all the three portions align in the vertical direction with respect to the sheet plane of FIG. 20.

Sixth Embodiment

Figure 21:
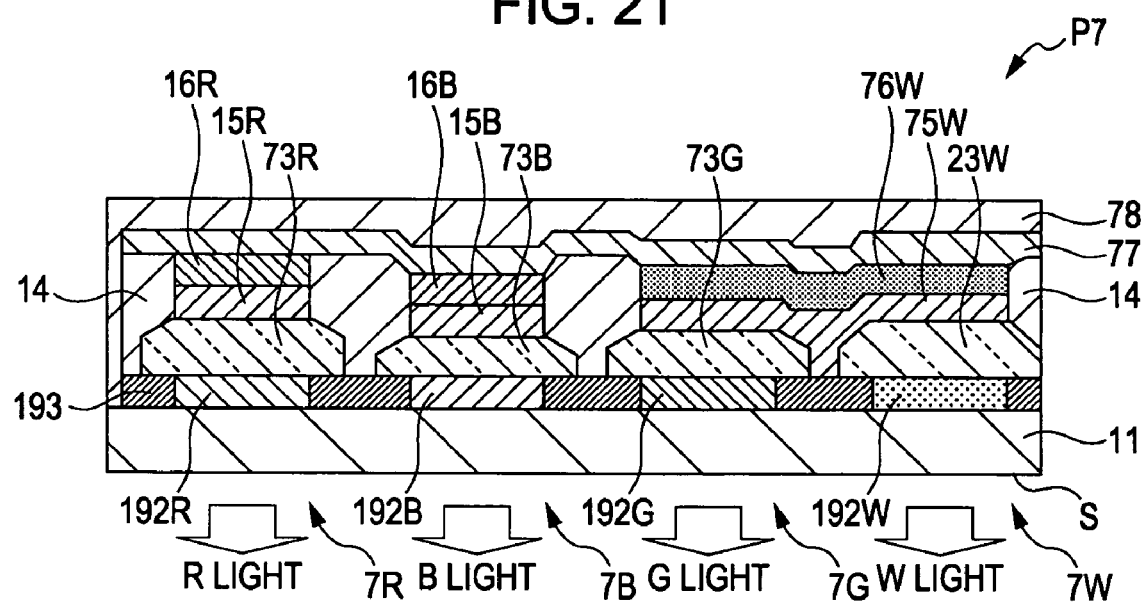
FIG. 21 is a sectional view of a pixel P7 according to a sixth embodiment of the invention.

FIG. 21 is a sectional view of a pixel P7 included in a light-emitting device according to a sixth embodiment of the invention. This light-emitting device is of the bottom-emission type. Therefore, the material for the element substrate 11 is limited to a transparent material such as glass. Because this light-emitting device is a bottom-emission type, it includes the color filters 192 and the black matrix 193 disposed between the element substrate 11 and the transparent electrodes 13 instead of the reflective layers 12 and the color filter substrate 19.

That is, the light-emitting layers of subpixels 7 are provided above the element substrate 11, and the color filters 192 of a red subpixel 7R, a green subpixel 7G, and a blue subpixel 7B are disposed between the element substrate 11 and the light-emitting layers. Active elements such as thin-film transistors (TFTS) to be disposed on the element substrate 11, if necessary, are positioned on the black matrix 193 so as to be blocked by the black matrix 193.

The pixel P7 corresponds to the pixel P2 in FIG. 11. The pixel P7 includes a red subpixel 7R, a blue subpixel 7B, a green subpixel 7G, and a white subpixel 7W in place of the red subpixel 2R, the blue subpixel 2B, the green subpixel 2G, and the white subpixel 2W of the pixel P2. Differences between the subpixel 7 and the subpixel 2 will now be described. However, description regarding the color filters 192 and the black matrix 193 will be omitted.

The white subpixel 7W and the green subpixel 7G differ from the white subpixel 2W and the green subpixel 1G in that the white subpixel 7W and the green subpixel 7G have a green transparent electrode 73G, a white hole-injection layer 75W, a white-light-emitting layer 76W, a common electrode 77, and a sealing layer 78 in place of, and having different shapes from, the green transparent electrode 13G, the white hole-injection layer 15W, the white-light-emitting layer 16W, the common electrode 17 and the sealing layer 18. Similarly to the common electrode 17 and the sealing layer 18, the common electrode 77 and the sealing layer 78 are formed of a transparent material in the embodiment. However, in a modification, the common electrode 77 and the sealing layer 78 may be formed of a light-blocking material.

The red subpixel 7R differs from the red subpixel 1R in that the red subpixel 7R has a red transparent electrode 73R, the common electrode 77, and the sealing layer 78 in place of, and having different shapes from, the red transparent electrode 13R, the common electrode 17, and the sealing layer 18. The blue subpixel 7B differs from the blue subpixel 1B in that the blue subpixel 7B has a blue transparent electrode 73B, the common electrode 77, and the sealing layer 78 in place of, and having different shapes from, the blue transparent electrode 13B, the common electrode 17, and the sealing layer 18.

As described above, the invention can be applied to a bottom-emission light-emitting device. Such a bottom-emission light-emitting device may be modified to produce the same advantage as in the first to fifth embodiments. For example, the common electrode 77 may be made of a reflective material so as to intensify the emitted light by interference of light. Alternatively, a passivation layer made of silicon nitride, for example, may be formed over the color filters 192 and the black matrix 193, a thin-film layer made of a highly reflective material such as silver or aluminum may be formed thereon with a thickness of about 5 nm to 15 nm as a semi-reflective layer (half mirror), which is transparent and reflective, and transparent electrodes may be formed thereon. In such a case, the optical distance between the semi-reflective layer and the reflective layer (common electrode) can be adjusted by appropriately setting the thicknesses of the transparent electrodes, or the thicknesses of both the transparent electrodes and the organic layers. Alternatively, the transparent electrodes constituted by thin films made of gold or silver may function as the semi-reflective layer. Also in such a case, the optical distance between the semi-reflective layer and the reflective layer can be adjusted by appropriately setting the thicknesses of the transparent electrodes, or the thicknesses of both the transparent electrodes and the organic functional layers. That is, each of the red, green, and blue subpixels may include a semi-reflective layer disposed between the light-emitting layer and the color filter. In such a case, an auxiliary positive electrode made of ITO may also be included. Alternatively, the white subpixel may be provided with the semi-reflective layer and the transparent electrode may have a plurality of portions having different thicknesses.

Other Modifications

The above-described embodiments may be modified as follows. The following modifications are also within the scope of the invention.

For example, if transparent electrodes and a passivation layer, made of a transparent material such as silicon nitride or silicon oxynitride, reside between the reflective layer and the semi-reflective layer, the optical distance between the reflective layer and the semi-reflective layer may be adjusted by the thicknesses of the transparent electrodes and the passivation layer.

Figure 22:
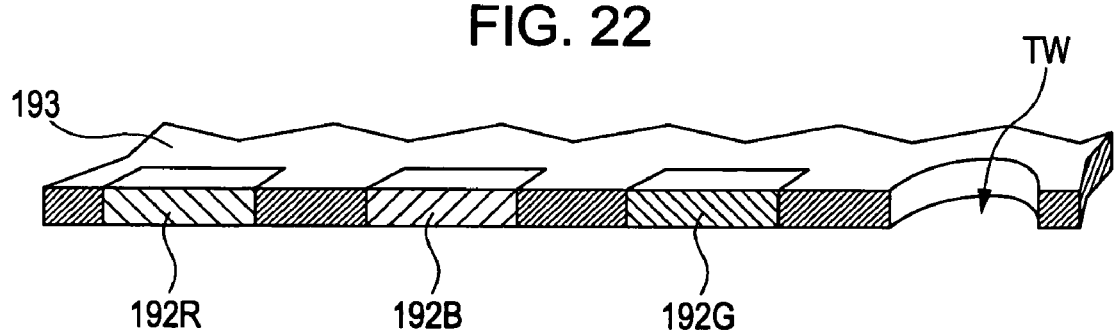
FIG. 22 shows an exemplary modification of the embodiments of the invention.

FIG. 22 shows a modification including a through window TW in place of the color filter 192W. The through window TW encloses a transparent gas, such as air. That is, in the above-described embodiments, a region provided with the color filter 192W may be replaced by a region filled with a transparent gas.

Figure 23A:
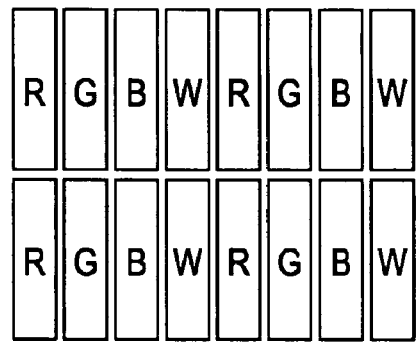
FIG. 23A shows another exemplary modification of the embodiments of the invention.
Figure 23B:
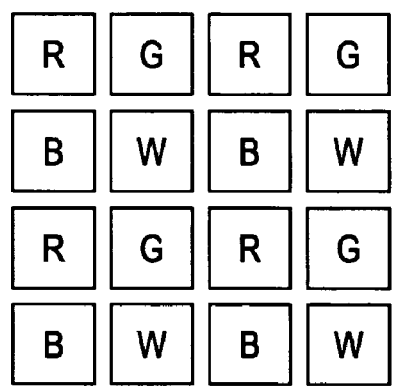
FIG. 23B shows another exemplary modification of the embodiments of the invention.
Figure 23C:
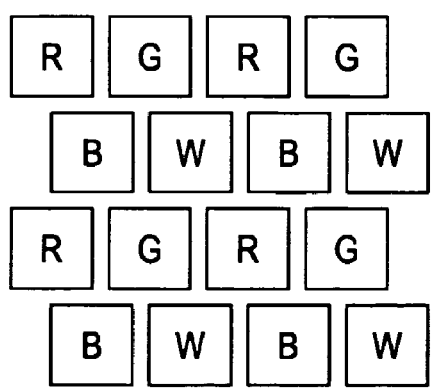
FIG. 23C shows another exemplary modification of the embodiments of the invention.

FIG. 23A shows a possible exemplary subpixel arrangement in which the subpixels are arranged in a stripe pattern, with green and white subpixels sandwiching another subpixel (in FIG. 23A, blue subpixel). In this case, the green subpixel and the white subpixel have separate light-emitting layers. However, because the materials for those light-emitting layers are the same (a white-light-emitting material), the process for manufacturing the light-emitting device does not become complicated. FIG. 23B shows another possible exemplary subpixel arrangement in which the subpixels are arranged in a matrix, with green and white subpixels adjoining each other. FIG. 23C shows another possible exemplary subpixel arrangement in which the matrix pattern in FIG. 23B is modified such that columns of the subpixels in odd-numbered rows do not match columns of the subpixels in even-numbered rows. It is possible that the arrangements shown in FIGS. 23B and 23C be modified so that green and white subpixels do not adjoin each other. Reference characters R, G, B, and W in FIGS. 23A to 23C denote a red subpixel, a green subpixel, a blue subpixel, and a white subpixel, respectively.

Another possible modification is that among a pair of electrodes of the organic EL element, the electrode near the element substrate serves as a negative electrode and the electrode remote from the element substrate serves as a positive electrode.

Further, an EL element other than the organic EL element (i.e., an inorganic EL element), for example, may be used as the light-emitting element.

Application

Figure 24:
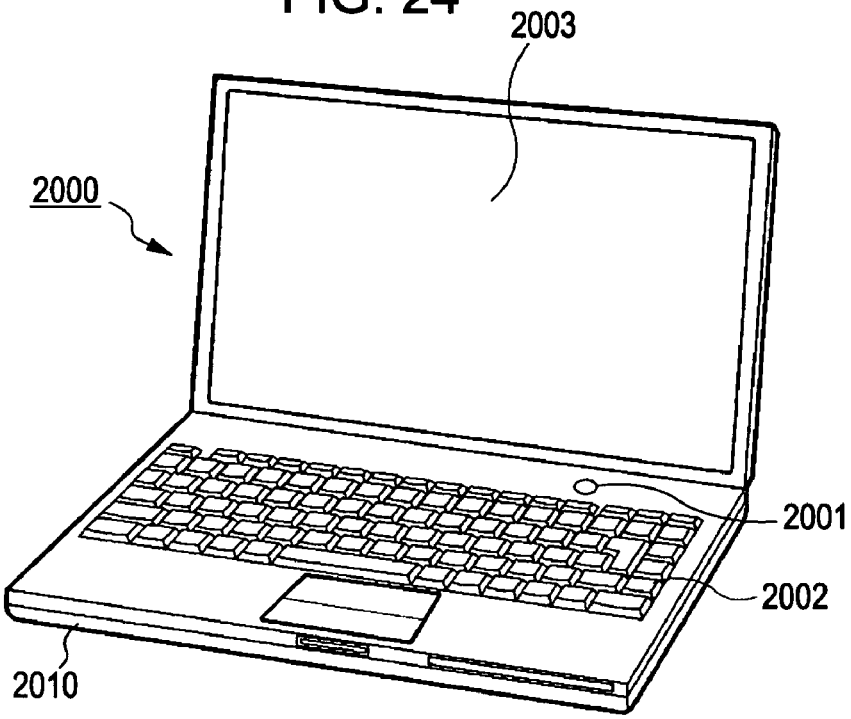
FIG. 24 shows a mobile personal computer including the light-emitting device 10 as a display device.
Figure 25:
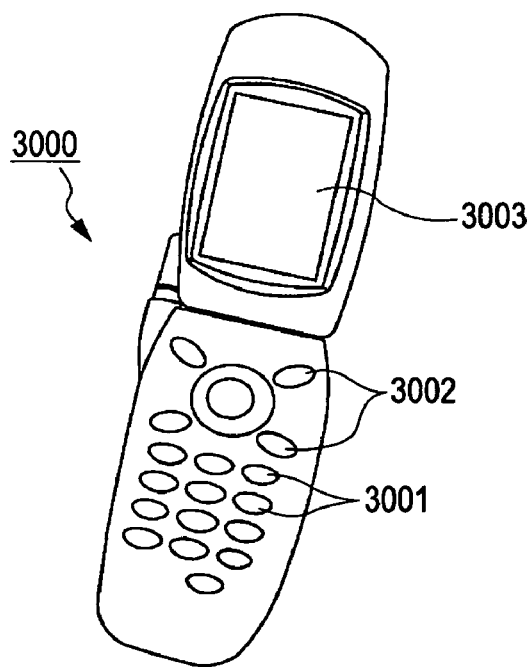
FIG. 25 shows a mobile phone including the light-emitting device 10 as a display device.
Figure 26:
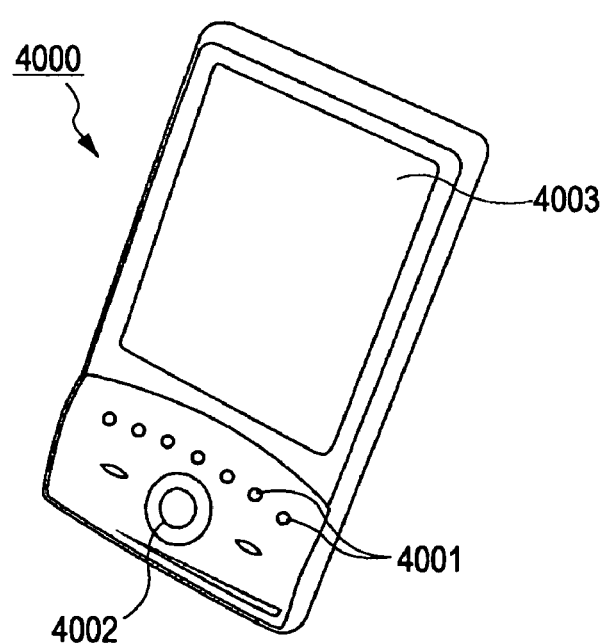
FIG. 26 shows a personal digital assistant including the light-emitting device 10 as a display device.

The light-emitting devices described above can be applied to various electronic apparatuses. FIGS. 24 to 26 show examples of electronic apparatuses including the light-emitting device 10 as a display device.

FIG. 24 shows a mobile personal computer including the light-emitting device 10 as a display device. A personal computer 2000 includes a display device 2003 (the light-emitting device 10) and a main body 2010. The main body 2010 includes a power switch 2001 and a keyboard 2002.

FIG. 25 shows a mobile phone including the light-emitting device 10 as a display device. A mobile phone 3000 includes a plurality of operation buttons 3001, a plurality of scroll buttons 3002, and a display device 3003 (the light-emitting device 10). Operation of the scroll buttons 3002 scrolls the screen displayed on the light-emitting device 10.

FIG. 26 shows a personal digital assistant (PDA) including the light-emitting device 10 as a display device. A PDA 4000 includes a plurality of operation buttons 4001, a power switch 4002, and a display device 4003 (the light-emitting device 10). Operation of the power switch 4002 displays various kinds of information, such as an address book and a schedule book, on the light-emitting device 10.

Examples of electronic apparatuses to which the light-emitting devices described above can be applied are not limited to those shown in FIGS. 24 to 26, but also include digital still cameras, televisions, video cameras, car navigation systems, pagers, electronic organizers, electronic papers, word processors, workstations, videophones, point-of-sale (POS) terminals, printers, copiers, video players, and apparatuses including touch panels.

What is claimed is:

1. A light-emitting device comprising:
   a planar element substrate; and
   a plurality of pixels constituting a screen, each of the plurality of pixels including four subpixels, which are a red subpixel, a green subpixel, a blue subpixel, and a white subpixel,
   wherein the red subpixel has a light-emitting layer formed of a red-light-emitting material that emits red light and extending along the screen, and a color filter provided above the light-emitting layer to transmit red light;
   wherein the green subpixel has a light-emitting layer formed of a white-light-emitting material that emits white light and extending along the screen, and a color filter provided above the light-emitting layer to transmit green light;
   wherein the blue subpixel has a light-emitting layer formed of a blue-light-emitting material that emits blue light and extending along the screen, and a color filter provided above the light-emitting layer to transmit blue light;
   wherein the white subpixel has a light-emitting layer formed of the white-light-emitting material and extending along the screen;
   wherein the red subpixel light emitting layer is spaced apart from the green subpixel light emitting layer and the blue subpixel light emitting layer;
   wherein the green subpixel light emitting layer is spaced apart from the blue subpixel light emitting layer;
   wherein the green and white subpixels have a common layer;
   wherein the light-emitting layer of each of the four subpixels is provided on the element substrate;
   wherein the light-emitting layer of each of the red, green, and blue subpixels is disposed between the color filter thereof and the element substrate;
   wherein each of the four subpixels has a transmissive layer that transmits light provided between the light-emitting layer thereof and the element substrate;
   wherein the white subpixel has a reflective layer that reflects light provided between the transmissive layer thereof and the element substrate; and
   wherein the transmissive layer of the white subpixel has at least three portions having different thicknesses.

2. The light-emitting device according to claim 1,
   wherein each of the red, green, and blue subpixels has a reflective layer that reflects light provided between the transmissive layer thereof and the element substrate.

3. The light-emitting device according to claim 1, further comprising: a light-absorbing layer that absorbs light provided under the element substrate.

4. The light-emitting device according to claim 1,
wherein an emission spectrum of the white-light-emitting material includes a plurality of peaks, and
wherein each of the at least three portions of the transmissive layer of the white subpixel has a thickness such that light having a wavelength corresponding to one of the plurality of peaks is intensified by interference.

5. The light-emitting device according to claim 4,
wherein the transmissive layer of the white subpixel has three portions having different thicknesses, and
wherein the emission spectrum of the white-light-emitting material includes three peaks, which are a first peak corresponding to a wavelength of red light, a second peak corresponding to a wavelength of green light, and a third peak corresponding to a wavelength of blue light.

6. The light-emitting device according to claim 1,
wherein each of the red, green, and blue subpixels has a semi-reflective layer, which is transparent and reflective, between the light-emitting layer thereof and the color filter thereof.

7. The light-emitting device according to claim 1,
wherein the green and white subpixels are disposed side by side and have a common layer,
wherein the light-emitting layer of the green subpixel constitutes a part of the common layer, and
wherein the light-emitting layer of the white subpixel constitutes a remaining part of the common layer.

8. An electronic apparatus comprising the light-emitting device according to claim 1.

9. The light-emitting device according to claim 1, wherein the white-light-emitting material is disposed between green and white color filters, located on a first side of the white-light-emitting material, and the element substrate, located on a second side of the white-light-emitting material and is opposite of the first side of the white-light-emitting material, and the white-light-emitting material does not have the blue and red color filters disposed on either side of the white-light-emitting material.

10. The light-emitting device according to claim 1, further comprising:
a plurality of partitions, the plurality of partitions being disposed to separate the red subpixel from the blue and green subpixels and the blue subpixel from the green subpixel.

11. A method for manufacturing a light-emitting device including a planar element substrate and a plurality of pixels constituting a screen, each of the plurality of pixels including four subpixels, which are a red subpixel, a green subpixel, a blue subpixel, and a white subpixel, wherein the red subpixel has a light-emitting layer formed of a red-light-emitting material that emits red light and extending along the screen, and a color filter provided above the light-emitting layer to transmit red light, wherein the green subpixel has a light-emitting layer formed of a white-light-emitting material that emits white light and extending along the screen, and a color filter provided above the light-emitting layer to transmit green light, wherein the blue subpixel has a light-emitting layer formed of a blue-light-emitting material that emits blue light and extending along the screen, and a color filter provided above the light-emitting layer to transmit blue light, wherein the white subpixel has a light-emitting layer formed of the white-light-emitting material and extending along the screen, and wherein the green and white subpixels are disposed side by side, the method comprising:
integrally forming the light-emitting layers of the green and white subpixels with the white-light-emitting material on an element substrate extending along the screen, wherein
the red subpixel light emitting layer is spaced apart from the green subpixel light emitting layer and the blue subpixel light emitting layer;
the green subpixel light emitting layer is spaced apart from the blue subpixel light emitting layer;
wherein the green and white subpixels have a common layer;
wherein the light-emitting layer of each of the four subpixels is provided on the element substrate;
wherein the light-emitting layer of each of the red, green, and blue subpixels is disposed between the color filter thereof and the element substrate;
wherein each of the four subpixels has a transmissive layer that transmits light provided between the light-emitting layer thereof and the element substrate;
wherein the white subpixel has a reflective layer that reflects light provided between the transmissive layer thereof and the element substrate; and
wherein the transmissive layer of the white subpixel has at least three portions having different thicknesses.

12. A method for manufacturing a light-emitting device including a planar element substrate and a plurality of pixels constituting a screen, each of the plurality of pixels including four subpixels, which are a red subpixel, a green subpixel, a blue subpixel, and a white subpixel, wherein the red subpixel has a light-emitting layer formed of a red-light-emitting material that emits red light and extending along the screen, and a color filter provided above the light-emitting layer to transmit red light, wherein the green subpixel has a light-emitting layer formed of a white-light-emitting material that emits white light and extending along the screen, and a color filter provided above the light-emitting layer to transmit green light, wherein the blue subpixel has a light-emitting layer formed of a blue-light-emitting material that emits blue light and extending along the screen, and a color filter provided above the light-emitting layer to transmit blue light, wherein the white subpixel has a light-emitting layer formed of the white-light-emitting material and extending along the screen, wherein the light-emitting layer of each of the four subpixels is provided on the element substrate, wherein the light-emitting layer of each of the red, green, and blue subpixels is disposed between the color filter thereof and the element substrate, wherein each of the four subpixels has a transmissive layer that transmits light provided between the light-emitting layer thereof and the element substrate, wherein the white subpixel has a reflective layer that reflects light provided between the transmissive layer thereof and the element substrate, and wherein the transmissive layer of the white subpixel has a plurality of at least three portions having different thicknesses, the method comprising:
forming a subtransmissive layer that covers an area of the white subpixel parallel with the element substrate with a transparent material; and
removing a part of the subtransmissive layer,
wherein the forming and the removing are performed alternately;
the red subpixel light emitting layer is spaced apart from the green subpixel light emitting layer and the blue subpixel light emitting layer;
the green subpixel light emitting layer is spaced apart from the blue subpixel light emitting layer; and
wherein the green and white subpixels have a common layer.

* * * * *